(12) United States Patent
Lim et al.

(10) Patent No.: US 11,302,885 B2
(45) Date of Patent: Apr. 12, 2022

(54) ELECTROLUMINESCENT DISPLAY DEVICE

(71) Applicant: LG Display Co., Ltd., Seoul (KR)

(72) Inventors: Hyeongjun Lim, Paju-si (KR); Hansun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 16/519,442

(22) Filed: Jul. 23, 2019

(65) Prior Publication Data

US 2020/0044178 A1     Feb. 6, 2020

(30) Foreign Application Priority Data

Jul. 31, 2018    (KR) ........................ 10-2018-0089420

(51) Int. Cl.
     *H01L 51/50*      (2006.01)
     *H01L 27/32*      (2006.01)
     *H01L 51/52*      (2006.01)

(52) U.S. Cl.
     CPC ...... *H01L 51/5044* (2013.01); *H01L 27/3211* (2013.01); *H01L 27/3246* (2013.01); *H01L 51/5278* (2013.01); *H01L 27/322* (2013.01)

(58) Field of Classification Search
     CPC ............. H01L 51/5044; H01L 27/3211; H01L 27/3246; H01L 51/5278; H01L 27/3258
See application file for complete search history.

(56) References Cited

U.S. PATENT DOCUMENTS

| | | | | |
|---|---|---|---|---|
| 6,914,649 | B2 * | 7/2005 | Liu | G02F 1/133514 |
| | | | | 345/694 |
| 2007/0014916 | A1 * | 1/2007 | Daniels | H01L 51/5012 |
| | | | | 427/66 |
| 2012/0248475 | A1 * | 10/2012 | Yamada | H01L 27/3211 |
| | | | | 257/89 |
| 2014/0103385 | A1 * | 4/2014 | Hatano | H01L 33/005 |
| | | | | 257/99 |
| 2017/0271421 | A1 * | 9/2017 | Jinbo | H01L 51/5253 |
| 2017/0279079 | A1 * | 9/2017 | Kim | H01L 51/5253 |

* cited by examiner

*Primary Examiner* — Phat X Cao
(74) *Attorney, Agent, or Firm* — Morgan, Lewis & Bockius LLP

(57) ABSTRACT

An electroluminescent display device includes: a substrate including: a first subpixel, a second subpixel, and a third subpixel, an insulating layer on the substrate, the insulating layer including a trench, a first electrode in each of the first to third subpixels on the insulating layer, an emission layer on the first electrode and the insulating layer, and a second electrode on the emission layer, wherein the trench is in a boundary between the first subpixel and the second subpixel, and wherein the trench is not in a boundary between the second subpixel and the third subpixel.

18 Claims, 12 Drawing Sheets

ELECTROLUMINESCENT DISPLAY DEVICE

CROSS-REFERENCE TO RELATED APPLICATION(S)

This application claims the benefit of and priority to Korean Patent Application No. 10-2018-0089420, filed on Jul. 31, 2018, the entirety of which is hereby incorporated by reference.

BACKGROUND

1. Technical Field

The present disclosure relates to an electroluminescent display device, and more particularly, to an electroluminescent display device configured to emit white light.

2. Discussion of the Related Art

In an electroluminescent display device, an emission layer is provided between an anode electrode and a cathode electrode. The emission layer emits light by an electric field generated between the above two electrodes, to thereby display an image.

The emission layer may include an organic material that emits light when an exciton is produced by a bond of an electron and a hole, and the exciton falls to a ground state from an excited state. Alternatively, the emission layer may include an inorganic material, such as quantum dot.

The emission layer may emit different-colored light for each subpixel, for example, red light, green light, blue light, or white light for each subpixel, or may emit the same-colored light for each subpixel, for example, white light for each subpixel. If the emission layer emits different-colored light for each subpixel, a different-colored emission layer has to be deposited for each subpixel through the use of a predetermined mask. This has limitations because of the increase in the number of mask processes. Also, if a mask is not aligned precisely, it is difficult to accurately deposit the emission layer for each subpixel. In contrast, if the emission layer emits same-colored light for each subpixel, for example, white light for each subpixel, there is no need for a mask to pattern the emission layer, whereby any problem caused by a mask process is not generated.

Recently, a head-mounted display (HMD) device has been developed to show a virtual reality (VR) in which a focus is formed within a short distance in front of user's eyes. In the case of the head-mounted display (HMD) device, realistically, it is difficult to manufacture a mask due to compact intervals of pixels by a high resolution, and also to precisely align the mask. Thus, in the case of the electroluminescent display device applied to the head-mounted display (HMD) device, a method of forming the emission layer that emits the white light for each subpixel may be easily applied because it has no requirement for the accurate mask manufacturing process and the precise mask alignment process.

However, in the method of forming the emission layer configured to emit the white light for each subpixel, on the assumption that an interval between each subpixel becomes compact to realize a high resolution, if the emission layer of any one subpixel emits light, charges in the corresponding emission layer may be transferred to another emission layer of the neighboring subpixel. Therefore, a leakage current may be generated, to thereby deteriorate picture quality.

SUMMARY

Accordingly, the present disclosure is directed to an electroluminescent display device that substantially obviates one or more of the issues due to limitations and disadvantages of the related art.

An aspect of the present disclosure is to provide an electroluminescent display device that prevents deterioration of picture quality caused by a leakage current.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: a substrate including: a first subpixel, a second subpixel, and a third subpixel, an insulating layer on the substrate, the insulating layer including a trench, a first electrode in each of the first to third subpixels on the insulating layer, an emission layer on the first electrode and the insulating layer, and a second electrode on the emission layer, wherein the trench is in a boundary between the first subpixel and the second subpixel, and wherein the trench is not in a boundary between the second subpixel and the third subpixel.

In another aspect, there is provided an electroluminescent display device, including: a substrate including: a first subpixel, a second subpixel, and a third subpixel, a first electrode in each of the first to third subpixels, an emission layer on the first electrode, the emission layer being in the first to third subpixels and in a boundary area between each of the first to third subpixels, the entire emission layer being contiguous from the second subpixel to the third subpixel, at least some of the emission layer being noncontiguous in the boundary area between the first subpixel and the second subpixel, and a second electrode on the emission layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
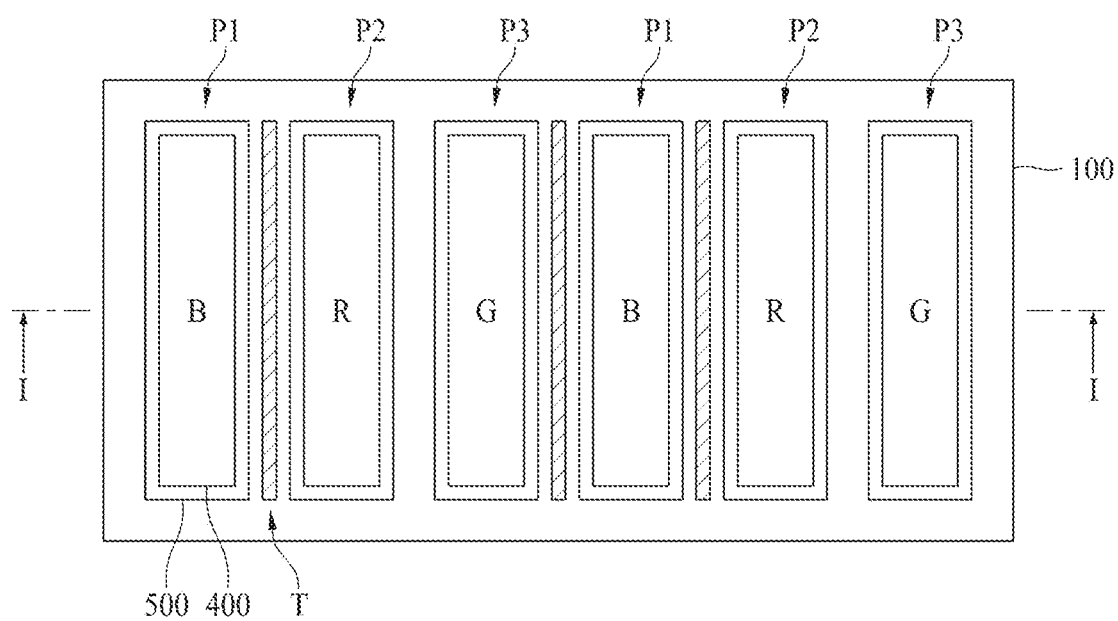
FIG. 1 is a plane view illustrating an electroluminescent display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an electroluminescent display device according to an embodiment of the present disclosure will be described in detail with reference to the accompanying drawings.

FIG. 1 is a plane view illustrating an electroluminescent display device according to an embodiment of the present disclosure.

As shown in FIG. 1, the electroluminescent display device according to an embodiment of the present disclosure may include a substrate 100, a first electrode 400, a fence structure 500, and a trench (T). There may be a plurality of subpixels (P1, P2, P3) on the substrate 100.

The plurality of subpixels (SP1, P2, P3) may include a first subpixel (P1), a second subpixel (P2), and a third subpixel (P3). The first subpixel (P1), the second subpixel (P2), and the third subpixel (P3) may be arranged in sequence. For example, the second subpixel (P2) may be adjacent to one side of the first subpixel (P1), e.g., a right side of the first subpixel (P1), and the third subpixel (P3) may be adjacent to the other side of the first subpixel (P1), e.g., a left side of the first subpixel (P1). Also, the second subpixel (P2) and the third subpixel (P3) may be adjacent to each other.

The first subpixel (P1) may emit blue (B) light, the second subpixel (P2) may emit red (R) light, and the third subpixel (P3) may emit green (G) light, but embodiments are not limited to this structure. For example, the second subpixel (P2) may emit green (G) light, and the third subpixel (P3) may emit red (R) light.

According to an embodiment of the present disclosure, the second subpixel (P2) configured to emit the red (R) light or green (G) light may be adjacent to the third subpixel (P3) configured to emit the green (G) light or red (R) light. This adjacent arrangement of the subpixels (P2, P3) configured to the red (R) light and green (G) light may not form a trench (T) between the two subpixels (P2, P3), which will be described in detail later.

The first electrode 400 may be individually patterned for each subpixel (P1, P2, P3). For example, one of the first electrode 400 may be in the first subpixel (P1), another of the first electrode 400 may be in the second subpixel (P2), and another of the first electrode 400 may be in the third subpixel (P3). The first electrode 400 may function as an anode of the electroluminescent display device.

The fence structure 500 may surround the periphery of the first electrode 400. An exposed area of the first electrode 400, which may be exposed without being covered by the fence structure 500, may form an emission area. Thus, the emission area may be defined by the fence structure 500.

The trench (T) may be provided in the boundary between each of the plurality of subpixels (P1, P2, P3). The trench (T) may prevent a leakage current from being generated between the neighboring subpixels (P1, P2, P3). On the presumption that an interval between the subpixels (P1, P2, P3) may be compact to realize a high resolution, when the emission layer in any one subpixel (P1, P2, P3) emits light, charges in the corresponding emission layer may be transferred to other neighboring emission layers (P1, P2, P3), and there may be a possibility of leakage current. Thus, in an embodiment of the present disclosure, the trench (T) may be formed in the boundary between the subpixels (P1, P2, P3) so that some of the emission layer in the trench (T) may be disconnected. For example, it may be possible to reduce or prevent a leakage current between the neighboring subpixels (P1, P2, P3).

For example, according to an embodiment of the present invention, the trench (T) may be not formed in the boundary of all the subpixels (P1, P2, P3), but may be formed only in boundaries of some of the subpixels (P1, P2, P3), so that it may be possible to reduce or prevent an aperture ratio from being lowered by the trench (T). Accordingly, an interval between the first electrode 400 of the first subpixel (P1) and the first electrode 400 of the second subpixel (P2), which may adjacent to each other with the trench (T) interposed in-between, or between the first electrode 400 of the first subpixel (P1) and the first electrode 400 of the third subpixel (P3), which may be adjacent to each other with the trench (T) interposed in-between, may be larger than an interval between the first electrode 400 of the second subpixel (P2) and the first electrode 400 of the third subpixel (P3), which may be adjacent to each other without the trench (T) interposed in-between.

For example, the trench (T) may be formed in the boundary between the first subpixel (P1) for emitting blue (B) light and the second subpixel (P2) for emitting red (R) light, and between the first subpixel (P1) for emitting blue (B) light and the third subpixel (P3) for emitting green (G) light. However, the trench (T) may be not in the boundary between the second subpixel (P2) for emitting red (R) light and the third subpixel (P3) for emitting green (G) light, which will be described in detail with reference to FIG. 2.

Figure 2:
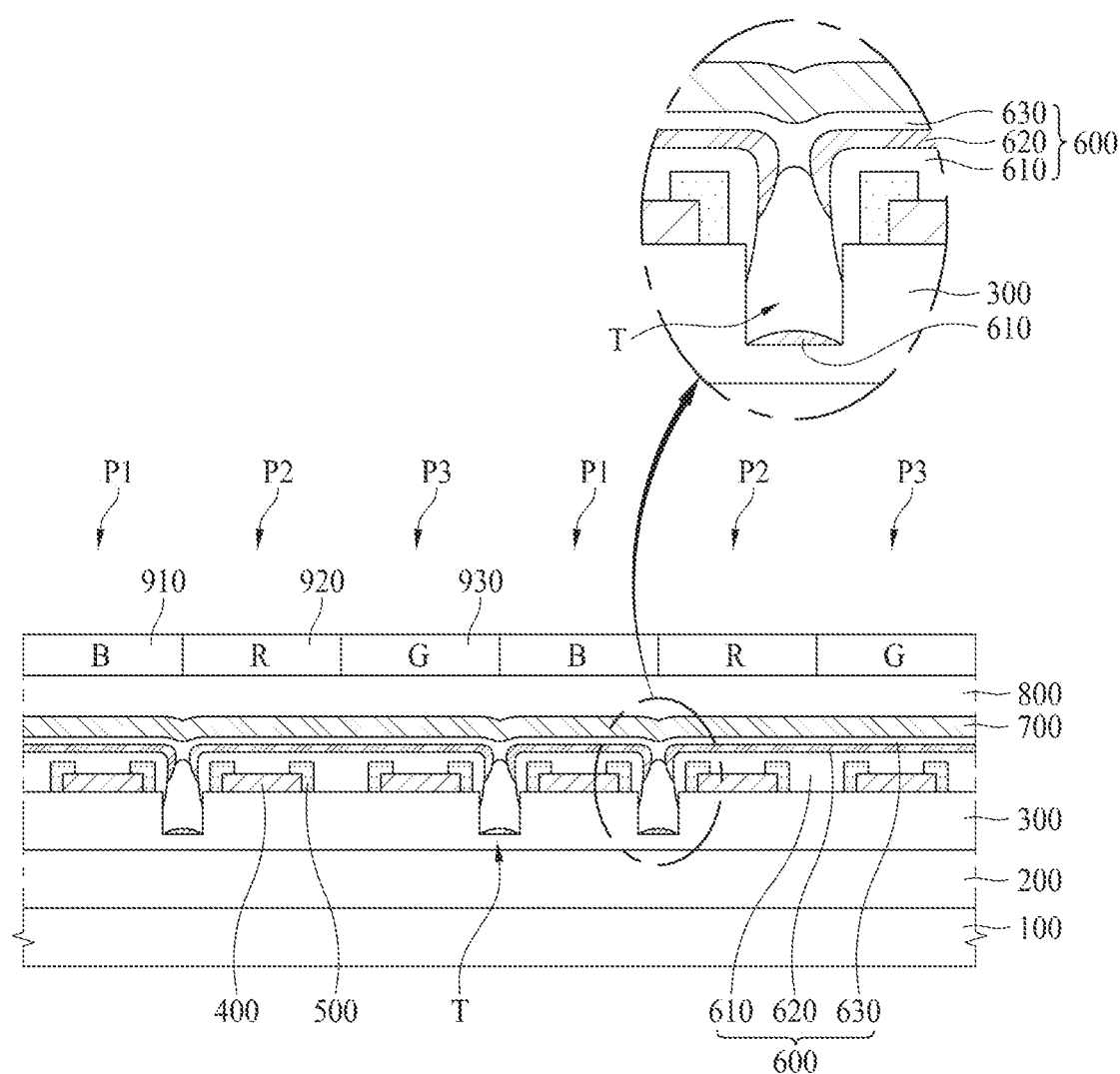
FIG. 2 is a cross-sectional view illustrating the electroluminescent display device according to an embodiment of the present disclosure, which corresponds to a cross-sectional view along line I-I of FIG. 1.

FIG. 2 is a cross-sectional view illustrating the electroluminescent display device according to an embodiment of the present disclosure, which corresponds to a cross-sectional view along line I-I of FIG. 1.

As shown in FIG. 2, the electroluminescent display device according to an embodiment of the present disclosure may include the substrate 100, a circuit device layer 200, an insulating layer 300, the first electrode 400, the fence structure 500, an emission layer 600, a second electrode 700, an encapsulation layer 800, and a color filter layer 910, 920, and 930.

The substrate 100 may include glass or plastic, but embodiments are not limited to these materials. For example, the substrate 100 may include a semiconductor material, such as silicon wafer. The substrate 100 may include a transparent material or an opaque material. The first subpixel (P1), the second subpixel (P2), and the third subpixel (P3) may be on the substrate 100. The first subpixel (P1) may emit blue (B) light, the second subpixel (P2) may emit red (R) light, and the third subpixel (P3) may emit green (G) light.

The electroluminescent display device according to an embodiment of the present disclosure may be a top-emission type in which emitted light may travel upwardly, but embodiments are not limited to this type. If the electroluminescent display device is formed in the top-emission type, the first substrate 100 may include an opaque material, as well as a transparent material.

The circuit device layer 200 may be on the substrate 100. In the circuit device layer 200, a circuit device including various signal lines, thin-film transistors, and a capacitor may be provided for each subpixel (P1, P2, P3). The signal lines may include a gate line, a data line, a power line, and a reference voltage line, and the thin-film transistors may include a switching thin-film transistor, a driving thin-film transistor, and a sensing thin-film transistor.

The switching thin-film transistor may be switched by a gate signal supplied to the gate line. The switching thin-film transistor may supply a data voltage, which may be supplied from the data line, to the driving thin-film transistor.

The driving thin-film transistor may be switched by the data voltage supplied from the switching thin-film transistor. The driving thin-film transistor may generate a data current from power source supplied from the power line, and may supply the data current to the first electrode 400.

The sensing thin-film transistor may sense a deviation of threshold voltage in the driving thin-film transistor, which may cause deterioration of picture quality. The sensing thin-film transistor may supply a current of the driving thin-film transistor to the reference voltage line in response to a sensing control signal supplied from the gate line or an additional sensing line.

The capacitor may maintain the data voltage supplied to the driving thin-film transistor for one frame period. The capacitor may be connected to each of gate and source terminals of the driving thin-film transistor.

The insulating layer 300 may be on the circuit device layer 200. The insulating layer 300 may protect the circuit device layer 200, and may also planarize an upper surface of the substrate 100. The insulating layer 300 may include an organic insulating material, but embodiments are not limited to this material. For example, the insulating layer 300 may include an inorganic insulating material.

The trench (T) having a groove structure may be in the insulating layer 300. The trench (T) may be formed only in the insulating layer 300, but embodiments are not limited to this structure. For example, the trench (T) may extend to the inside of the circuit device layer 200 below the insulating layer 300. The trench (T) may be in the boundary between the first subpixel (P1) and the second subpixel (P2), and between the first subpixel (P1) and the third subpixel (P3), but may not be in the boundary between the second subpixel (P2) and the third subpixel (P3).

The first electrode 400 may be patterned for each subpixel (P1, P2, P3) on the insulating layer 300. The first electrode 400 may be connected to the driving thin-film transistor in the circuit device layer 200. For example, the first electrode 400 may be connected to the source terminal or drain terminal of the driving thin-film transistor. For example, a contact hole for exposing the source terminal or drain terminal of the driving thin-film transistor may be formed in the insulating layer 300 and the circuit device layer 200. The first electrode 400 may be connected to the source terminal or drain terminal of the driving thin-film transistor via the contact hole.

The electroluminescent display device according to an embodiment of the present disclosure may be the top-emission type. For example, the first electrode 400 may upwardly reflect light emitted from the emission layer 600. For example, the first electrode 400 may have a dual-layered structure including a reflection layer configured to reflect light, and a transparent conductive layer configure to supply a hole to the emission layer 600.

The fence structure 500 may cover both ends of the first electrode 400 on the insulating layer 300. For example, the fence structure 500 may cover some areas of an upper surface and a lateral surface at both ends of the first electrode 400, and it may be possible to reduce or prevent a current from being concentrated on the ends of the first electrode 400, to reduce or prevent lowering of emission efficiency. For example, some areas of the upper surface of the first electrode 400, which may be exposed without being covered by the fence structure 500, may become the emission area. The fence structure 500 may include an inorganic insulating film, but embodiments are not limited to this structure.

The emission layer 600 may be provided on the first electrode 400 and the insulating layer 300. The emission layer 600 may be on the fence structure 500, and may also be in the boundary area among the plurality of subpixels (P1, P2, P3).

The emission layer 600 may emit white (W) light. For example, the emission layer 600 may include a plurality of stacks configured to emit different-colored light. For example, the emission layer 600 may include a first stack 610, a second stack 630, and a charge generation layer (CGL) 620 between the first stack 610 and the second stack 630.

The emission layer 600 may be formed inside the trench (T), and may also be formed over the trench (T). According to an embodiment of the present disclosure, the emission layer 600 may be inside the trench (T), and a resistance may be increased due to a long current path formed between the neighboring subpixels (P1, P2, P3), which may reduce a leakage current.

For example, with reference to an expanded view shown by an arrow in FIG. 2, the first stack 610 may be formed on an inner lateral surface of the trench (T), and may be formed on an inner lower surface of the trench (T). For example, some area of the first stack 610 on the inner lateral surface of the trench (T) may be disconnected (e.g., may have a disconnected or noncontiguous structure) from some area of the first stack 610 on the inner lower surface of the trench (T). Thus, some area of the first stack 610 on one lateral surface inside the trench (T), and more particularly, on the left lateral surface inside the trench (T), may be not connected to some area of the first stack 610 formed on the other lateral surface inside the trench (T), and more particularly, on the right lateral surface inside the trench (T). It should be appreciated that the terms "left" and "right" are used herein for convenience of explanation, and are interchangeable as should be appreciated by one of ordinary skill in the art. Accordingly, charges may be not transferred between the subpixels (P1, P2, P3), arranged with the trench (T) interposed in-between, through the first stack 610.

Also, the charge generation layer 620 may be formed at the inner lateral surface of the trench (T) while being on the first stack 610. For example, some area of the charge generation layer 620 on one lateral surface inside the trench (T), and more particularly, on the left lateral surface inside the trench (T) may be not connected to some area of the charge generation layer 620 on the other lateral surface inside the trench (T), and more particularly, on the right lateral surface inside the trench (T). Accordingly, charges may be not transferred between the subpixels (P1, P2, P3), arranged with the trench (T) interposed in-between, through the charge generation layer 620.

Also, the second stack 630 may be provided connectedly (e.g., may have a connected or contiguous structure) between the neighboring subpixels (P1, P2, P3), with the trench (T) interposed in-between, while being on the charge generation layer 620. Thus, charges may be transferred between the subpixels (P1, P2, P3), with the trench (T) interposed in-between, through the second stack 630, but embodiments are not limited to this structure. For example, the second stack 630 may be noncontiguous (e.g., may be provided disconnectedly or may have a disconnected structure) between the neighboring subpixels (P1, P2, P3) with the trench (T) interposed in-between, e.g., by appropriately adjusting a shape of the trench (T) and a deposition process of the emission layer 600. For example, some areas of a lower portion of the second stack 630, which may be adjacent to the charge generation layer 620, may be disconnectedly provided between the subpixels (P1, P2, P3).

Meanwhile, conductivity of the charge generation layer 620 may be higher than that of each of the first stack 610 and the second stack 630. For example, an N-type charge generation layer of the charge generation layer 620 may include a metal material, and conductivity of the charge generation layer 620 may be higher than that of each of the first stack 610 and the second stack 630. Thus, the charge transfer between the subpixels (P1, P2, P3), which may be adjacent to each other, may be generally made through the charge generation layer 620, and the charge transfer through the second stack 630 may be insignificant. Thus, according to an embodiment of the present disclosure, the charge generation layer 620 may be disconnectedly provided inside the trench (T) so that it may be possible to reduce the charge transfer between the subpixels (P1, P2, P3), which may be adjacent to each other, to reduce or prevent a leakage current.

According to an embodiment of the present disclosure, the trench (T) may be in the boundary area between the first subpixel (P1) and the second subpixel (P2), and in the boundary area between the first subpixel (P1) and the third subpixel (P3). Thus, at least some area of the emission layer 600, and for example, the charge generation layer 620 may be disconnectedly provided in the boundary area between the first subpixel (P1) and the second subpixel (P2), and in the boundary area between the first subpixel (P1) and the third subpixel (P3) so that it may be possible to reduce or prevent a leakage current in the area between the first subpixel (P1) and the second subpixel (P2) and between the first subpixel (P1) and the third subpixel (P3).

The trench (T) may not be in the boundary area between the second subpixel (P2) and the third subpixel (P3). When the entire emission layer 600, including the first stack 610, the charge generation layer (CGL) 620, and the second stack 630, is formed in the contiguous (e.g., connected) structure from the second subpixel (P2) to the third subpixel (P3), the charge generation layer 620 of the emission layer 600 may be contiguous (e.g., may be not disconnected or may have a connected structure) in the boundary area between the second subpixel (P2) and the third subpixel (P3), and a leakage current may be generated in the area between the second subpixel (P2) and the third subpixel (P3). However, even if a leakage current were generated in the area between the second subpixel (P2) and the third subpixel (P3), a light transmittance would be blocked by the use of color filter layer 910, 920, and 930, which may reduce or prevent any influence on picture quality. A reason will be described later with reference to FIG. 3.

The second electrode 700 may be on the emission layer 600. The second electrode 700 may function as a cathode of the electroluminescent display device. In a similar manner as the emission layer 600, the second electrode 700 may be in each of the subpixels (P1, P2, P3), and may also be in the boundary area between the subpixels (P1, P2, P3).

The electroluminescent display device according to an embodiment of the present disclosure may be formed in the top-emission type, whereby the second electrode 700 may include a transparent conductive material capable of upwardly transmitting light emitted from the emission layer 600. Also, the second electrode 700 may include a semi-transparent electrode so that it may be possible to obtain a micro-cavity effect for each subpixel (P1, P2, P3). When the second electrode 700 includes the semi-transparent electrode, the micro-cavity effect may be obtained by repetitive reflection and re-reflection of the light between the second electrode 700 and the first electrode 400, to improve light efficiency.

The encapsulation layer 800 may be formed on the second electrode 700, to reduce or prevent external moisture from permeating into the emission layer 600. The encapsulation layer 800 may be formed as a single-layered structure of an inorganic insulating material, or as a deposition structure obtained by alternately depositing an inorganic insulating material and an organic insulating material, but embodiments are not limited to these structures.

The color filter layer 910, 920, and 930 may be formed on the encapsulation layer 800. The color filter layer 910, 920, and 930 may include the blue (B) color filter 910 in the first subpixel (P1), the red (R) color filter 920 in the second subpixel (P2), and the green (G) color filter in the third subpixel (P3), but embodiments are not limited to this structure. Although not shown, a black matrix may be additionally provided between each of the color filters in the color filter layers 910, 920, and 930, to reduce or prevent light from leaking in the boundary area between the subpixels (P1, P2, P3).

Figure 3:
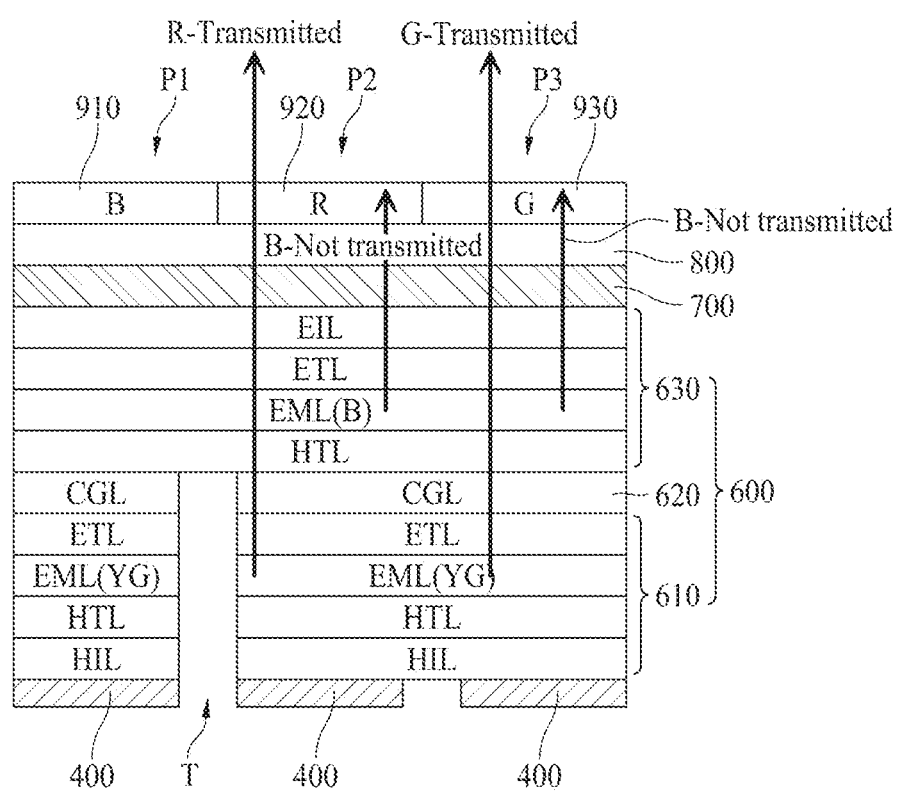
FIG. 3 is a cross-sectional view illustrating an electroluminescent display device including an emission layer according to an embodiment of the present disclosure.

FIG. 3 is a cross-sectional view illustrating the electroluminescent display device including the emission layer according to an embodiment of the present disclosure.

In FIG. 3, for convenience of explanation, only the first electrode 400, the emission layer 600, the second electrode 700, the encapsulation layer 800, and the color filter layer 910, 920, and 930 are illustrated for the three subpixels (P1, P2, P3). As shown in FIG. 3, the first electrode 400, the emission layer 600, the second electrode 700, the encapsulation layer 800, and the color filter layer 910, 920, and 930 may be deposited in sequence. The first electrode 400 may be patterned for each subpixel (P1, P2, P3).

The emission layer 600 may include the first stack 610, the second stack 630, and the charge generation layer (CGL) 620 on the first electrode 400. The first stack 610 may be on the first electrode 400, and the first stack 610 may be formed in a deposition structure obtained by sequentially depositing a hole injecting layer (HIL), a hole transporting layer (HTL), a yellow-green (YG) emitting layer (EML(YG)), and an electron transporting layer (ETL).

The first stack 610 may be noncontiguous (e.g., may be disconnectedly provided or may have a disconnected structure) in the boundary area between the first subpixel (P1) and the second subpixel (P2), for example, in the trench (T). However, the first stack 610 may be contiguous, e.g., may be connectedly provided or may have a connected structure) in the boundary area between the second subpixel (P2) and the third subpixel (P3).

The charge generation layer (CGL) 620 may supply charges to the first stack 610 and the second stack 630. The charge generation layer (CGL) 620 may include an N-type charge generation layer configured to supply an electron to the first stack 610, and a P-type charge generation layer configured to supply a hole to the second stack 630. The N-type charge generation layer may include a dopant of a metal material.

The charge generation layer (CGL) 620 may be disconnectedly provided in the boundary area between the first subpixel (P1) and the second subpixel (P2), for example, in the trench (T). However, the charge generation layer (CGL) 620 may be connectedly provided in the boundary area between the second subpixel (P2) and the third subpixel (P3).

The second stack 630 may be on the first stack 610, and the second stack 630 may be formed in a deposition structure obtained by sequentially depositing a hole transporting layer (HTL), a blue (B) emitting layer (EML(B)), an electron transporting layer (ETL), and an electron injecting layer (EIL). The second stack 630 may be connectedly provided between the first subpixel (P1) and the second subpixel (P2), and may also be connectedly provided between the second subpixel (P2) and the third subpixel (P3).

The second electrode 700 may be on the emission layer 600, the encapsulation layer 800 may be on the second electrode 700, and the color filter layer 910, 920, and 930 may be on the second electrode 700. The color filter layer 910, 920, and 930 may include the blue (B) color filter 910 in the first subpixel (P1), the red (R) color filter 920 in the second subpixel (P2), and the green (G) color filter 930 in the third subpixel (P3).

According to an embodiment of the present disclosure, the charge generation layer 620 may be disconnectedly provided in the boundary between the first subpixel (P1) and the second subpixel (P2) so that it may be possible to reduce or prevent a leakage current between the first subpixel (P1) and the second subpixel (P2). The charge generation layer 620 may be connectedly provided, without any disconnection, across the boundary between the second subpixel (P2) and the third subpixel (P3), and a leakage current may be generated between the second subpixel (P2) and the third subpixel (P3). However, even if a leakage current were generated between the second subpixel (P2) and the third subpixel (P3), it would have no influence on picture quality. A reason will be described as follows.

According to an embodiment of the present disclosure, on the presumption that the second subpixel (P2) is in an on-state, and the third subpixel (P3) is in an off-state, even is a leakage current were generated between the second subpixel (P2) and the third subpixel (P3), red (R) light may be emitted only from the second subpixel (P2), and light may not be emitted from the third subpixel (P3). For example, if a leakage current were generated in the third subpixel (P3) due to a charge transfer from the second subpixel (P2) to the third subpixel (P3), an emitting portion by the leakage current may become the second stack 630. In this case, if the second stack 630 were configured to emit blue (B) light, the blue (B) light emitted by the leakage current may not pass through the green (G) color filter 930 provided in the third subpixel (P3), and light may be not emitted from the third subpixel (P3).

For example, if the second subpixel (P2) were in an on-state, an electric field may be formed between the second electrode 700 and the first electrode 400 inside the second subpixel (P2), and yellow-green (YG) light may be emitted from the yellow-green (YG) emitting layer (EML(YG)) of the first stack 610, blue (B) light may be emitted from the blue (B) emitting layer (EML(B)) of the second stack 630, and only the red (R) light may be transmitted by passing through the red (R) color filter 920.

If the third subpixel (P3) were in an off-state, an electric field may be not formed between the second electrode 700 and the first electrode 400 inside the third subpixel (P3). However, an electric field may be formed between the charge generation layer 620 and the second electrode 700 by the aforementioned leakage current. Thus, blue (B) light may be emitted only from the blue (B) emitting layer (EML(B)) of the second stack 630, and the emitted light may be not transmitted through the green (G) color filter 930. As a result, even though the leakage current may be generated, any light may not be emitted from the third subpixel (P3), which may be in an off-state.

As such, according to an embodiment of the present disclosure, the yellow-green (YG) emitting layer (EML (YG)) may be in the first stack 610, and the blue (B) emitting layer (EML(B)) may be in the second stack 630. If the blue (B) emitting layer (EML(B)) were in the first stack 610, and the yellow-green (YG) emitting layer (EML(YG)) were in the second stack 630, an electric field may be formed between the charge generation layer 620 and the second electrode 700 by the aforementioned leakage current, in a case of the on-state of the third subpixel (P3), and yellow-green (YG) colored light may be emitted from the second stack 630, and the emitted light may be transmitted through the green (G) color filter 930. As a result, green (G) light may be emitted from the third subpixel (P3) in the off-state due to the aforementioned leakage current.

Thus, according to an embodiment of the present disclosure, even though the leakage current may be generated between the second subpixel (P2) and the third subpixel (P3), light may not be emitted from any one of the subpixels (P2, P3) when in the off-state. Thus, the trench (T) may be not provided in the boundary between the second subpixel (P2) and the third subpixel (P3), wheandreby it may be possible to reduce a trench (T) formation area, to improve an aperture ratio.

On the presumption that the leakage current may be generated between the first subpixel (P1) and the second subpixel (P2), if the second subpixel (P2) were in an on-state, and the first subpixel (P1) were in an off-state, the blue (B) light may be emitted from the first subpixel (P1) in the off-state. Thus, according to an embodiment of the present disclosure, a reason why the charge generation layer 620 may be disconnectedly provided in the trench (T) formed in the boundary between the first subpixel (P1) and the second subpixel (P2) may be to reduce or prevent the leakage current between the first subpixel (P1) and the second subpixel (P2). If the leakage current were generated between the first subpixel (P1) and the second subpixel (P2), it may cause a problem related to deterioration of picture quality.

Also, according to an embodiment of the present disclosure, a reason why the charge generation layer 620 may be disconnectedly provided in the trench (T) formed in the boundary between the first subpixel (P1) and the third subpixel (P3) may be to reduce or prevent the leakage current between the first subpixel (P1) and the third subpixel (P3). If the leakage current were generated between the first subpixel (P1) and the third subpixel (P3), it may cause a problem related to deterioration of picture quality.

Figure 4:
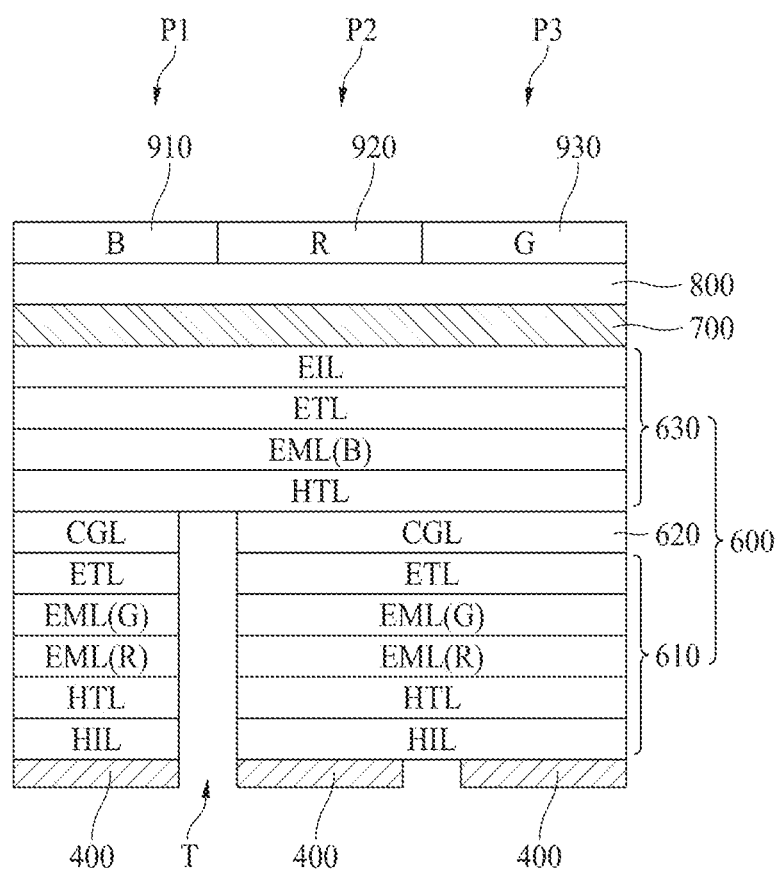
FIG. 4 is a cross-sectional view illustrating an electroluminescent display device including an emission layer according to an embodiment of the present disclosure.

FIG. 4 is a cross-sectional view illustrating an electroluminescent display device including an emission layer according to an embodiment of the present disclosure.

Instead of a yellow-green (YG) emitting layer (EML (YG)), a red (R) emitting layer (EML(R)) and a green (G) emitting layer (EML(G)) may be in a first stack 610. Otherwise, the electroluminescent display device of the FIG. 4 example is substantially similar to the electroluminescent display device of the FIG. 3 example. Thus, hereinafter, only the different structures will be described.

With reference to FIG. 4, a red (R) emitting layer (EML (R)) and a green (G) emitting layer (EML(G)) may be sequentially formed between a hole transporting layer (HTL) and an electron transporting layer (ETL) in a first stack 610. Thus, in the example of FIG. 4, white light may be emitted by mixing light emitted from the red (R) emitting layer (EML(R)) and the green (G) emitting layer (EML(G)) in the first stack 610 with light emitted from a blue (B) emitting layer (EML(B)) in a second stack 630.

In a similar manner as FIG. 3, in the example of FIG. 4, the blue (B) emitting layer (EML(B)) may be provided in the second stack 630. Thus, even though a leakage current may be generated between a second subpixel (P2) and a third subpixel (P3), a light emission may not be generated in either of the subpixels (P2, P3), which may be in an off-state, so that it may be possible to reduce or prevent a problem related to deterioration of picture quality.

In FIG. 4, the green (G) emitting layer (EML(G)) may be disposed on an upper surface of the red (R) emitting layer (EML(R)), but embodiments are not limited to this structure. For example, the green (G) emitting layer (EML(G)) may be disposed below the red (R) emitting layer (EML(R)).

Figure 5:
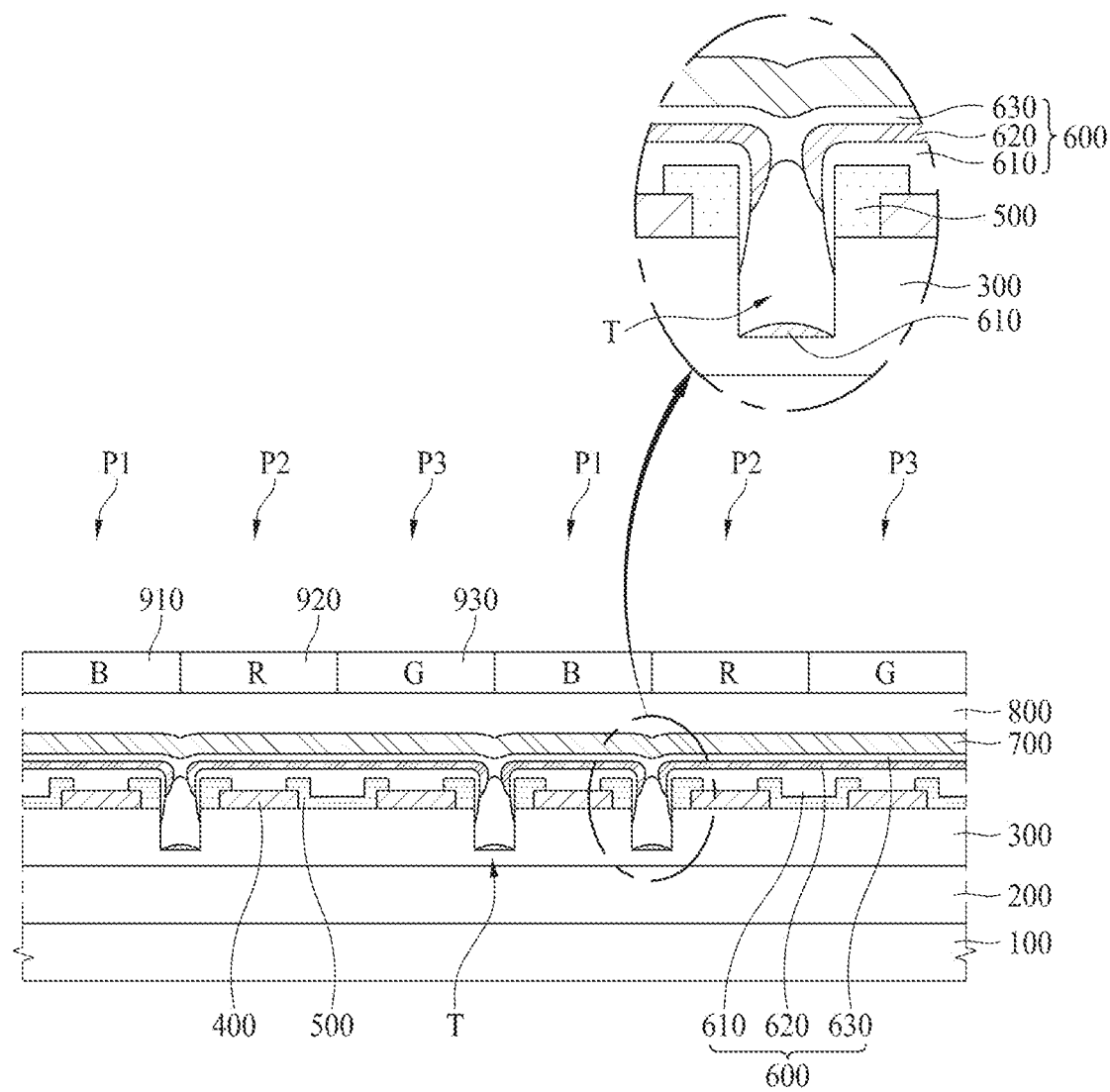
FIG. 5 is a cross-sectional view illustrating an electroluminescent display device according to an embodiment of the present disclosure.

FIG. 5 is a cross-sectional view illustrating an electroluminescent display device according to an embodiment of the present disclosure.

Except for a fence structure 500, the electroluminescent display device of the FIG. 5 example may be substantially similar in structure to the aforementioned electroluminescent display device of the FIG. 2 example. Thus, hereinafter, only the different structures will be described.

With reference to the above FIG. 2, the fence structure 500 may be patterned for each subpixel (P1, P2, P3) to cover the end of the first electrode 400. For example, one of the fence structures 500 may be formed on one of the first electrodes 400, and the fence structure 500 may be not in contact (e.g., direct contact) with the trench (T).

With reference to FIG. 5, a fence structure 500, configured to cover an end of a first electrode 400, may be not patterned for each subpixel (P1, P2, P3). Instead, the fence structure 500 may be formed as one body between second and third subpixels (P2, P3), which may be adjacent to each other. For example, the fence structure 500 may be formed in the entire boundary area between the second subpixel (P2) and the third subpixel (P3). Also, the fence structure 500 may be in contact (e.g., direct contact) with a trench (T) between the first subpixel (P1) and the second subpixel (P2), and with a trench (T) between the first subpixel (P1) and the third subpixel (P3).

In the example of FIG. 2, the trench (T) may be obtained by patterning the fence structure 500 for each subpixel (P1, P2, P3), and then removing predetermined areas of the insulating layer 300. Accordingly, the fence structure 500 may be not in contact (e.g., direct contact) with the trench (T).

In the example of FIG. 5, the trench (T) may be obtained by forming the fence structure 500 in the entire boundary area between the subpixels (P1, P2, P3), and then removing predetermined areas of the fence structure 500 and the insulating layer 300 therebelow from the boundary area between the first subpixel (P1) and the second subpixel (P2) and the boundary area between the first subpixel (P1) and the third subpixel (P3). Accordingly, the trench (T) may be formed in the fence structure 500 and the insulating layer 300 provided below the fence structure 500.

Figure 6:
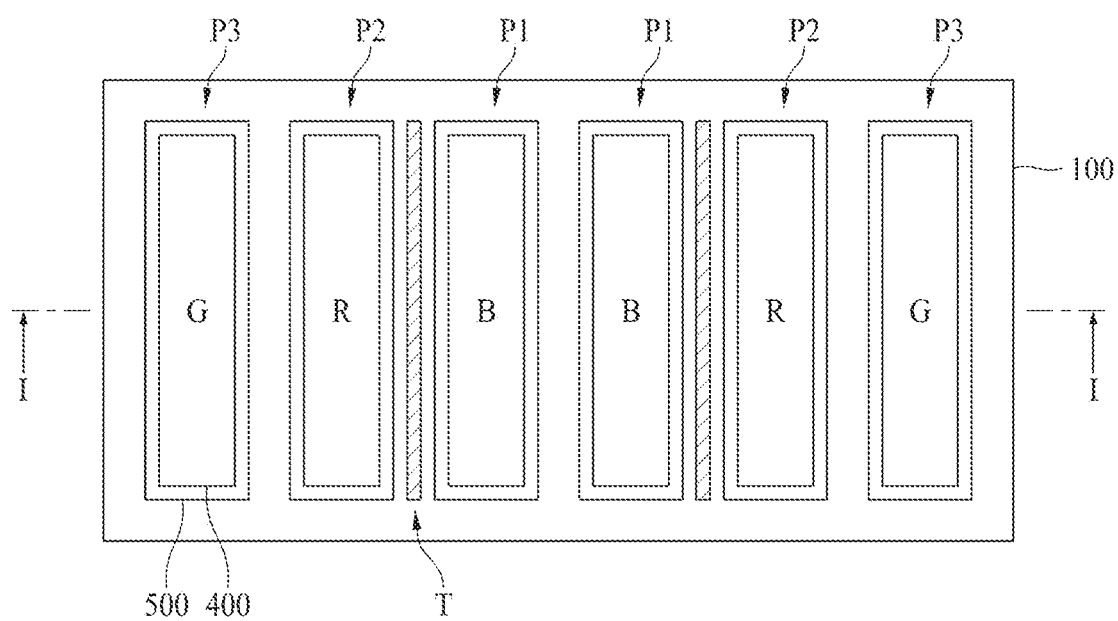
FIG. 6 is a plane view illustrating an electroluminescent display device according to an embodiment of the present disclosure.

FIG. 6 is a plane view illustrating an electroluminescent display device according to an embodiment of the present disclosure.

In FIG. 6, an arrangement of subpixels (P1, P2, P3) and a position of a trench (T) in the electroluminescent display device of FIG. 6 are different from those of FIG. 1. In the example of FIG. 1, an arrangement order of the first subpixel (P1), the second subpixel (P2) and the third subpixel (P3) may be substantially similarly applied to all pixels. For example, the first subpixel (P1) may be adjacent to the second subpixel (P2) and the third subpixel (P3), the second subpixel (P2) and the third subpixel (P3) may be adjacent to each other, and the first subpixel (P1) of one pixel may be not adjacent to the first subpixel (P1) of another neighboring pixel.

In the example of FIG. 6, an arrangement order of the third subpixel (P3), the second subpixel (P2) and the first subpixel (P1) may be applied to one pixel, and an arrangement order of the first subpixel (P1), the second subpixel (P2) and the third subpixel (P3) may be applied to another neighboring pixel. Accordingly, the second subpixel (P2) and the third subpixel (P3) may be adjacent to each other, and the first subpixel (P1) of one pixel may be adjacent to the first subpixel (P1) of another neighboring pixel.

In the example of FIG. 6, the second subpixel (P2) may emit red (R) light, and the third subpixel (P3) may emit green (G) light, but embodiments are not limited to this structure. For example, the second subpixel (P2) may emit green (G) light, and the third subpixel (P3) may emit red (R) light. Also, in FIG. 6, an arrangement order of the second subpixel (P2), the third subpixel (P3) and the first subpixel (P1) may be applied to one pixel, and an arrangement order of the first subpixel (P1), the third subpixel (P3) and the second subpixel (P2) may be applied to another neighboring pixel. For example, an arrangement structure of the first subpixel (P1), the second subpixel (P2), and the third subpixel (P3) may be changed in various ways, under a condition that the second subpixel (P2) and the third subpixel (P3) are adjacent to each other, and the first subpixel (P1) of one pixel is adjacent to the first subpixel (P1) of another pixel.

With reference to FIG. 6, the trench (T) may not be in the boundary between the second subpixel (P2) and the third subpixel (P3), which may be adjacent to each other, and may also not be in the boundary between the first subpixel (P1) of one pixel and the first subpixel (P1) of another neighboring pixel. Instead, the trench (T) may be formed in the boundary between the first subpixel (P1) and the second subpixel (P2), which may be adjacent to each other. Accordingly, in comparison to the above FIG. 1 example, the FIG. 6 example shows that a trench (T) formation area may be relatively reduced, and an aperture ratio may be improved.

Figure 7:
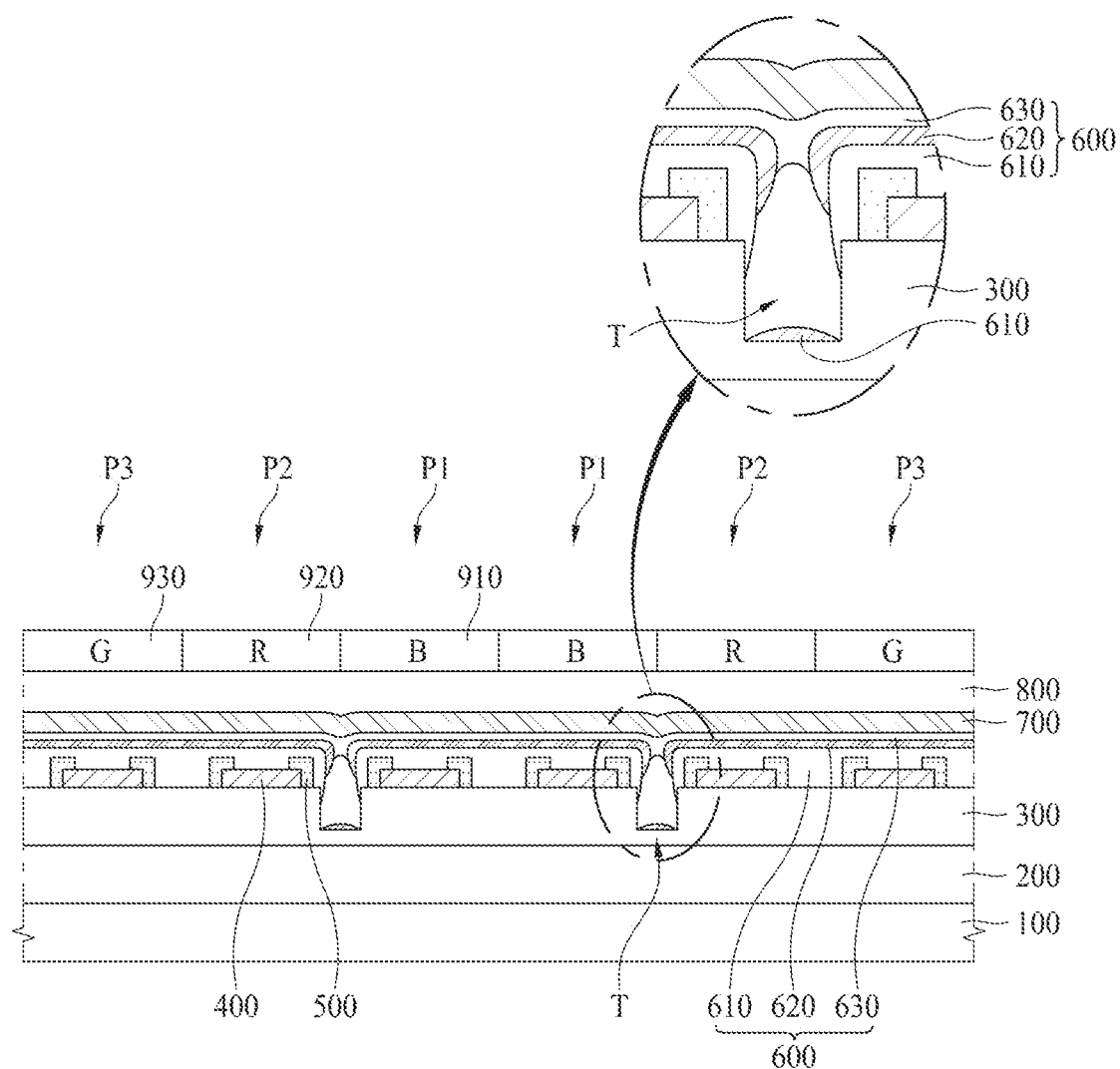
FIG. 7 is a cross-sectional view illustrating the electroluminescent display device according to an embodiment of the present disclosure, which is a cross-sectional view along line I-I of FIG. 6.

FIG. 7 is a cross-sectional view illustrating the electroluminescent display device according to an embodiment of the present disclosure, which is a cross-sectional view along line I-I of FIG. 6.

An arrangement structure of subpixels (P1, P2, P3) and a position of a trench (T) in the electroluminescent display device of the FIG. 7 example are different from those of the FIG. 2 example. Accordingly, the same reference numbers will be used throughout the drawings to refer to the same or like parts, and only the different structures will be described.

According to an embodiment of the present disclosure, the trench (T) may be formed in the boundary area between the first subpixel (P1) and the second subpixel (P2). Thus, at least some area of the emission layer 600, and for example, the charge generation layer 620 may be noncontiguous (e.g., may be disconnectedly provided or may have a disconnected structure) in the boundary area between the first subpixel (P1) and the second subpixel (P2) so that it may be possible to reduce or prevent a leakage current in the area between the first subpixel (P1) and the second subpixel (P2).

Meanwhile, the trench (T) may not be in the boundary area between the second subpixel (P2) and the third subpixel (P3), and may also not be in the boundary area between the first subpixel (P1) of one pixel and the first subpixel (P1) of another pixel. Thus, the charge generation layer 620 of the emission layer 600 may not be disconnected in the boundary area between the second subpixel (P2) and the third subpixel (P3), and may also not be disconnected in the boundary area between the first subpixel (P1) of one pixel and the first subpixel (P1) of another pixel. Thus, the leakage current may be generated in the area between the second subpixel (P2) and the third subpixel (P3), and may also be generated in the area between the first subpixel (P1) of one pixel and the first subpixel (P1) of another pixel. However, even though the leakage current may be generated in the area between the second subpixel (P2) and the third subpixel (P3), and the area between the first subpixel (P1) of one pixel and the first subpixel (P1) of another pixel, it may be possible to reduce or prevent any influence on picture quality. A reason will be described later with reference to FIG. 8. A fence structure 600 in the structure of the FIG. 7 example may be substantially similar to that of the FIG. 5 example.

Figure 8:
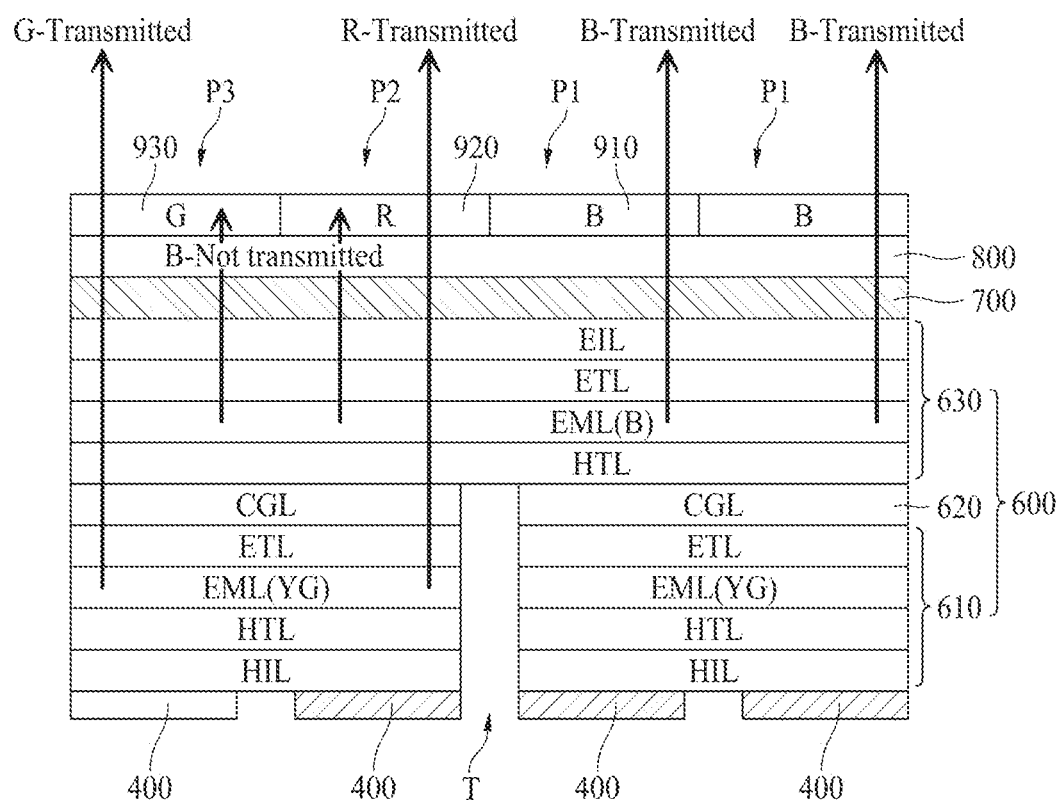
FIG. 8 is a cross-sectional view illustrating an electroluminescent display device including an emission layer according to an embodiment of the present disclosure.

FIG. 8 is a cross-sectional view illustrating an electroluminescent display device including an emission layer according to an embodiment of the present disclosure.

In FIG. 8, for convenience of explanation, a first electrode 400, an emission layer 600, a second electrode 700, an encapsulation layer 800, and a color filter layer 910, 920, and 930 are illustrated in four subpixels (P3, P2, P1, P1). As shown in FIG. 8, the first electrode 400, the emission layer 600, the second electrode 700, the encapsulation layer 800, and the color filter layer 910, 920, and 930 may be deposited in sequence. The first electrode 400 may be patterned for each subpixel (P3, P2, P1, P1). The emission layer 600 may include a first stack 610, a second stack 630, and a charge generation layer (CGL) 620 on the first electrode 400.

As described above with reference to the FIG. 3 example, the first stack 610 may be formed in a deposition structure obtained by sequentially depositing a hole injecting layer (HIL), a hole transporting layer (HTL), a yellow-green (YG) emitting layer (EML(YG)), and an electron transporting layer (ETL). Although not illustrated in FIG. 8, as illustrated in FIG. 4, the first stack 610 may include a red (R) emitting layer (EML(R)) and a green (G) emitting layer (EML(G)), instead of the yellow-green (YG) emitting layer (EML (YG)).

The first stack 610 may be noncontiguous (e.g., may be disconnectedly provided or may have a disconnected structure) in the boundary area between the first subpixel (P1) and the second subpixel (P2), for example, in the trench (T). However, the first stack 610 may be contiguous (e.g., may be connectedly provided or may have a connected structure) in the area between the second subpixel (P2) and the third subpixel (P3) and the area between the first subpixel (P1) of one pixel and the first subpixel (P1) of another pixel.

In a similar manner as the FIG. 3 example, the charge generation layer (CGL) 620 may be between the first stack 610 and the second stack 630, and the charge generation layer (CGL) 620 may include an N-type charge generation layer and a P-type charge generation layer. The charge generation layer (CGL) 620 may be disconnectedly provided in the boundary area between the first subpixel (P1) and the second subpixel (P2), for example, in the trench (T). However, the charge generation layer (CGL) 620 may be connectedly provided in the area between the second subpixel (P2) and the third subpixel (P3) and also connectedly provided in the area between the first subpixel (P1) of one pixel and the first subpixel (P1) of another pixel.

As shown in the example of FIG. 3, the second stack 630 may be formed in a deposition structure obtained by sequentially depositing a hole transporting layer (HTL), a blue (B) emitting layer (EML(B)), an electron transporting layer (ETL) and an electron injecting layer (EIL). The second stack 630 may be connectedly provided between the first subpixel (P1) and the second subpixel (P2), between the second subpixel (P2) and the third subpixel (P3), and between the first subpixel (P1) of one pixel and the first subpixel (P1) of another pixel.

The second electrode 700 may be on the emission layer 600, the encapsulation layer 800 may be on the second electrode 700, and the color filter layer 910, 920, and 930 may be on the second electrode 700. In a similar as the example of FIG. 3, in the example of FIG. 8, the charge generation layer 620 may be disconnectedly provided in the boundary between the first subpixel (P1) and the second subpixel (P2), and a leakage current may not be generated between the first subpixel (P1) and the second subpixel (P2).

Also, in a similar as the example of FIG. 3, in the example of FIG. 8, the charge generation layer 620 may be connectedly provided, without any disconnection, across the boundary between the second subpixel (P2) and the third subpixel (P3), and a leakage current may be generated between the second subpixel (P2) and the third subpixel (P3). However, even if the leakage current were generated between the second subpixel (P2) and the third subpixel (P3), a light emission may be reduced or prevented in any one of the subpixels (P2, P3), which may be in an off-state, and it may be possible to reduce or prevent any influence on picture quality. Accordingly, the trench (T) may be not in the boundary between the second subpixel (P2) and the third subpixel (P3), and it may be possible to reduce a trench (T) formation area, e.g., to improve an aperture ratio. A detailed description for the above structure may be substantially similar to that of FIG. 3, and a repetitive explanation for the same parts will be omitted.

With reference to FIG. 8, the charge generation layer 620 may be connectedly provided, without any disconnection, across the boundary between the first subpixel (P1) of one pixel and the first subpixel (P1) of another pixel, and the leakage current may be generated between the first subpixel (P1) of one pixel and the first subpixel (P1) of another pixel. However, even if the leakage current were generated between the first subpixel (P1) of one pixel and the first subpixel (P1) of another pixel, both the first subpixel (P1) of one pixel and the first subpixel (P1) of another pixel may emit the same blue (B) light so that it may be possible to reduce or prevent a problem related to a mixture of colored light, to reduce or prevent deterioration of picture quality.

For example, if the first subpixel (P1) of one pixel were in an on-state, and the first subpixel (P1) of another pixel were an off-state, an electric field may not be formed between the first electrode 400 and the second electrode 700 inside the first subpixel (P1) of another pixel, which may be in the off-state. However, as an electric field may be formed between the charge generation layer 620 and the second electrode 700 by the aforementioned leakage current, blue (B) light may be emitted from the blue (B) emitting layer (EML(B)) of the second stack 630, and the emitted light may be transmitted through the blue (B) color filter 930. Accordingly, under the circumstances that the first subpixel (P1) of one pixel, which may be in the on-state, may be adjacent to the first subpixel (P1) of another pixel, which may be in the off-state, the first subpixel (P1) of one pixel and the first subpixel (P1) of another pixel may emit the same blue (B) light. Thus, even though light may be emitted from the first subpixel (P1) of another pixel in the off-state, it may be possible to reduce or prevent a problem related to a mixture of colored light, to reduce or prevent deterioration of picture quality.

Figure 9:
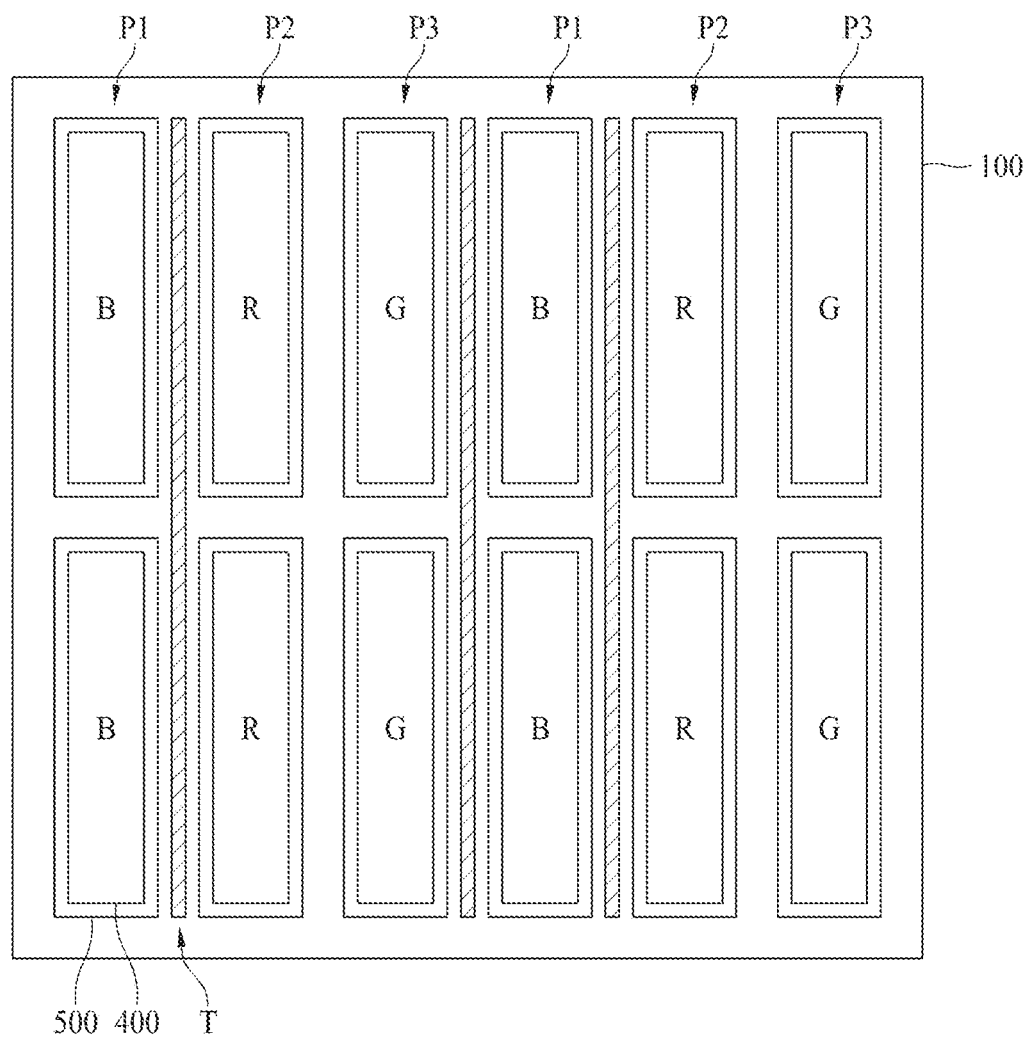
FIG. 9 is a plane view illustrating an electroluminescent display device according to an embodiment of the present disclosure.

FIG. 9 is a plane view illustrating an electroluminescent display device according to an embodiment of the present disclosure.

FIG. 9 shows that the subpixels (P1, P2, P3) of the above FIG. 1 may be arranged in a plurality of rows. As shown in the FIG. 9 example, a first electrode 400 may be on a substrate 100, and a fence structure 500 may be in the periphery of the first electrode 400.

On the substrate 100, as described above with reference to FIG. 1, the first subpixel (P1), the second subpixel (P2) and the third subpixel (P3) may be sequentially arranged along a horizontal direction, and an arrangement structure, including the first subpixel (P1), the second subpixel (P2), and the third subpixel (P3) arranged in the horizontal direction, may be repetitively provided to make a plurality of rows. For convenience of explanation, FIG. 9 shows only two rows. For example, along a vertical direction, the first subpixel (P1) for emitting the same blue (B) light may be disposed below the first subpixel (P1), the second subpixel (P2) for emitting the same red (R) light may be disposed below the second subpixel (P2), and the third subpixel (P3) for emitting the same green (G) light may be disposed below the third subpixel (P3).

Accordingly, along the vertical direction, the subpixels (P1, P2, P3) for emitting the same-colored light may be arranged in a straight line. Thus, even if the leakage current were generated between the subpixels (P1, P2, P3) for emitting the same-colored light, it may be possible to reduce or prevent a problem related to a mixture of colored light, to reduce or prevent deterioration of picture quality. Accordingly, the trench (T) may not be formed in the boundaries between the subpixels (P1, P2, P3) that are configured to emit the same-colored light and are adjacently disposed along the vertical direction.

In a similar manner as the example of FIG. 1, along the horizontal direction, the trench (T) may be formed in the boundary between the first subpixel (P1) and the second subpixel (P2), and in the boundary between the first subpixel (P1) and the third subpixel (P3). However, the trench (T) may be not formed in the boundary between the second subpixel (P2) and the third subpixel (P3).

For example, the trench (T) may be formed in a contiguous (or consecutive) straight-line structure along the vertical direction. For example, the trench (T) may be formed in the downwardly consecutive straight-line structure from the boundary between the first subpixel (P1) and the second subpixel (P2) in the first row to the boundary between the first subpixel (P1) and the second subpixel (P2) in the second row. Also, the trench (T) may be formed in the downwardly contiguous straight-line structure from the boundary between the first subpixel (P1) and the third subpixel (P3) in the first row to the boundary between the first subpixel (P1) and the third subpixel (P3) may in the second row.

Figure 10:
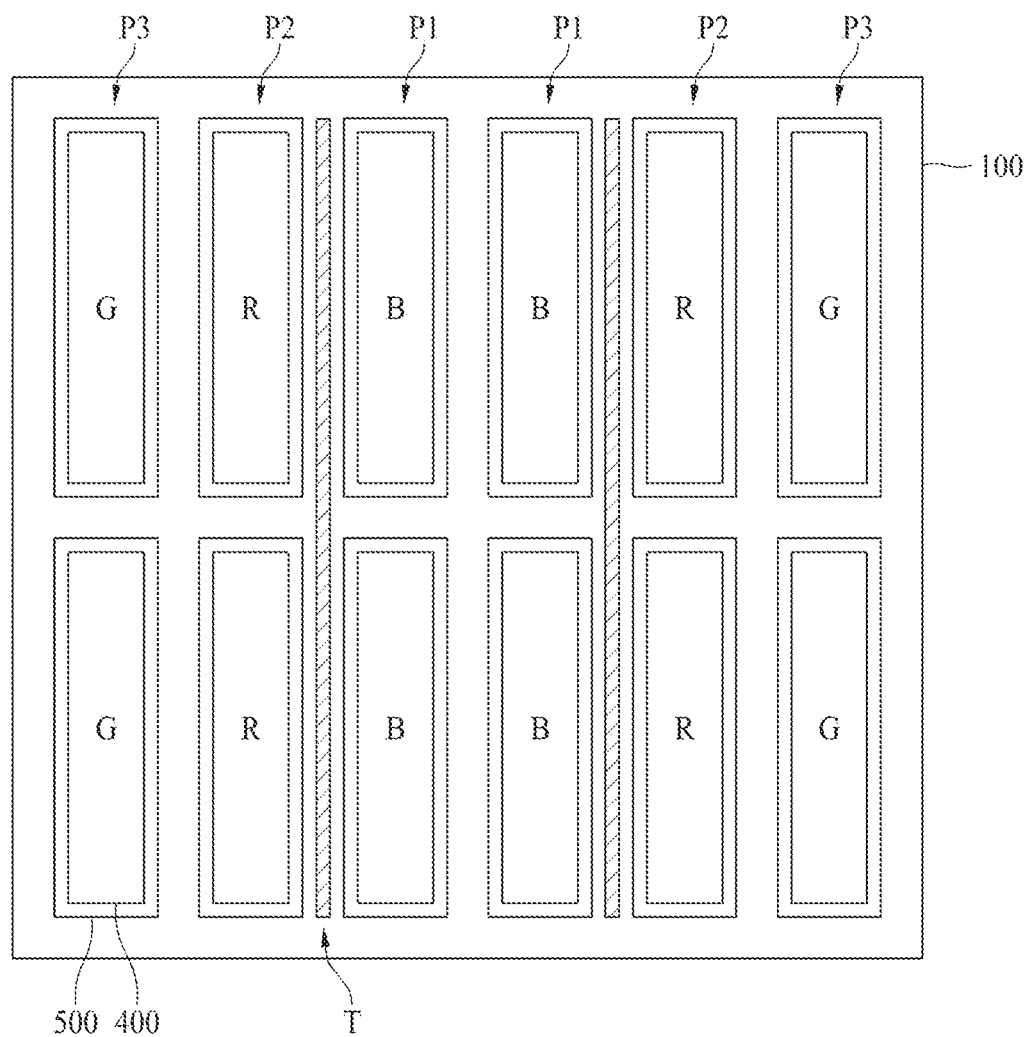
FIG. 10 is a plane view illustrating an electroluminescent display device according to an embodiment of the present disclosure.

FIG. 10 is a plane view illustrating an electroluminescent display device according to an embodiment of the present disclosure.

FIG. 10 shows that the subpixels (P1, P2, P3) of the above FIG. 6 may be arranged in a plurality of rows. As shown in the FIG. 10 example, a first electrode 400 may be on a substrate 100, and a fence structure 500 may be in the periphery of the first electrode 400.

On the substrate 100, as described above with reference to FIG. 6, an arrangement order, along a horizontal direction, of the third subpixel (P3), the second subpixel (P2) and the first subpixel (P1) may be applied to one pixel, and an arrangement order, along the horizontal direction, of the first subpixel (P1), the second subpixel (P2) and the third subpixel (P3) may be applied to another neighboring pixel. Accordingly, an arrangement structure, including the first subpixel (P1), the second subpixel (P2), and the third subpixel (P3), in one pixel and another pixel arranged in the horizontal direction may form a plurality of rows. For convenience of explanation, FIG. 10 shows only two rows.

For example, along a vertical direction, the first subpixel (P1) for emitting the same blue (B) light may be disposed below the first subpixel (P1), the second subpixel (P2) for emitting the same red (R) light may be disposed below the second subpixel (P2), and the third subpixel (P3) for emitting the same green (G) light may be disposed below the third subpixel (P3). Accordingly, along the vertical direction, the subpixels (P1, P2, P3) for emitting the same-colored light may be arranged in a straight line. Thus, even if the leakage current were generated between the subpixels (P1, P2, P3) for emitting the same-colored light, it may be possible to reduce or prevent a problem related to a mixture of colored light, to reduce or prevent deterioration of picture quality. Accordingly, the trench (T) may not be in the boundary between the subpixels (P1, P2, P3) that emit the same-colored light and are adjacently disposed along the vertical direction.

In a similar manner as the above FIG. 6 example, along the horizontal direction, the trench (T) may be formed in the boundary between the first subpixel (P1) and the second subpixel (P2). However, the trench (T) may be not formed in the boundary between the second subpixel (P2) and the third subpixel (P3), or between the first subpixel (P1) of one pixel and the first subpixel (P1) of another pixel.

For example, the trench (T) may be formed in a contiguous (or consecutive) straight-line structure along the vertical direction. For example, the trench (T) may be formed in a downwardly contiguous straight-line structure from the boundary between the first subpixel (P1) and the second subpixel (P2) in the first row to the boundary between the first subpixel (P1) and the second subpixel (P2) in the second row.

In the above examples of FIGS. 9 and 10, the arrangement structure of the subpixels (P1, P2, P3) may be identically applied to the plurality of rows, which may be adjacent to each other in an up-and-down (e.g., vertical) direction. Although not shown, according to an embodiment of the present disclosure, the arrangement structure of the subpixels (P1, P2, P3) may be differently applied to the plurality of rows, which may be adjacent to each other in the up-and-down direction.

On the presumption that the arrangement structure of the subpixels (P1, P2, P3) may be differently applied to the plurality of rows, which may be adjacent to each other in the up-and-down direction, if the first subpixel (P1) were adjacent to the second or third subpixel (P2, P3) in the up-and-down direction, as described above, the trench (T) may be between the first subpixel (P1) and the second subpixel (P2), or between the first subpixel (P1) and the third subpixel (P3). If the second subpixel (P2) were adjacent to the third subpixel (P3) in the up-and-down direction, as described above, the trench (T) may not be between the second subpixel (P2) and the third subpixel (P3).

Although not shown, a fourth subpixel for emitting a white light, e.g., without a color filter, may be additionally provided in the electroluminescent display device according to an embodiment of the present disclosure. If the leakage current were generated in the fourth subpixel for emitting white light, blue (B) light may be emitted from the fourth subpixel. Thus, if the fourth subpixel were adjacent to the first subpixel (P) for emitting blue (B) light, a problem related to a mixture of colored light may be not generated. As such, the trench (T) may not be between the fourth subpixel and the first subpixel (P1). However, if the fourth subpixel were adjacent to the second subpixel (P2) for emitting red (R) light or the third subpixel (P3) for emitting green (G) light, a problem related to a mixture of colored light may be generated. Thus, the aforementioned trench (T) may be between the fourth subpixel and the second subpixel (P2), or between the fourth subpixel and the third subpixel (P3), for example.

According to an embodiment of the present disclosure, the trench may be in the boundary between the first subpixel and the second subpixel, and at least some of the emission layer may be disconnectedly provided inside the trench, to reduce or prevent a leakage current between the first subpixel and the second subpixel, and furthermore, to reduce or prevent picture quality from being deteriorated by the leakage current. Also, according to an embodiment of the present disclosure, it may be possible to reduce or prevent a problem related to the leakage current, even if the trench were not provided in the boundary between the second subpixel and the third subpixel, and it may be possible to reduce a trench formation area, e.g., to improve an aperture ratio.

Figure 11A:
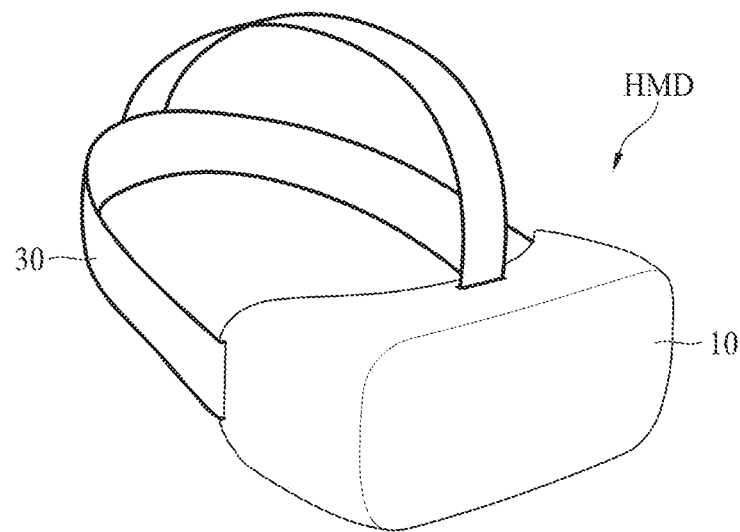
FIGS. 11A to 11C illustrate examples of an electroluminescent display device according to an embodiment of the present disclosure, which relate to a head-mounted display (HMD) device.
Figure 11B:
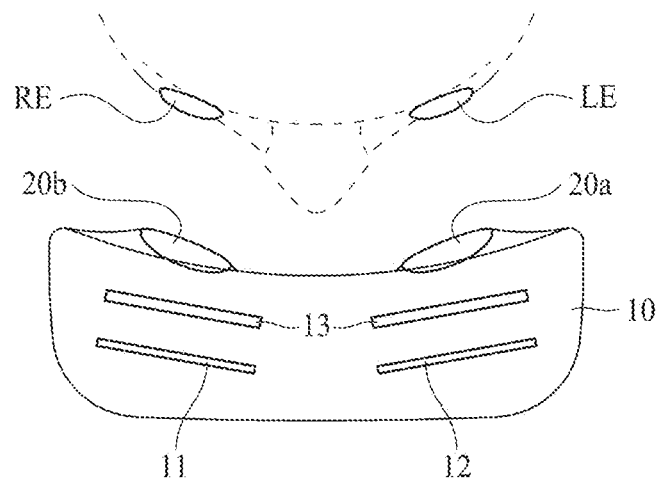
Figure 11C:
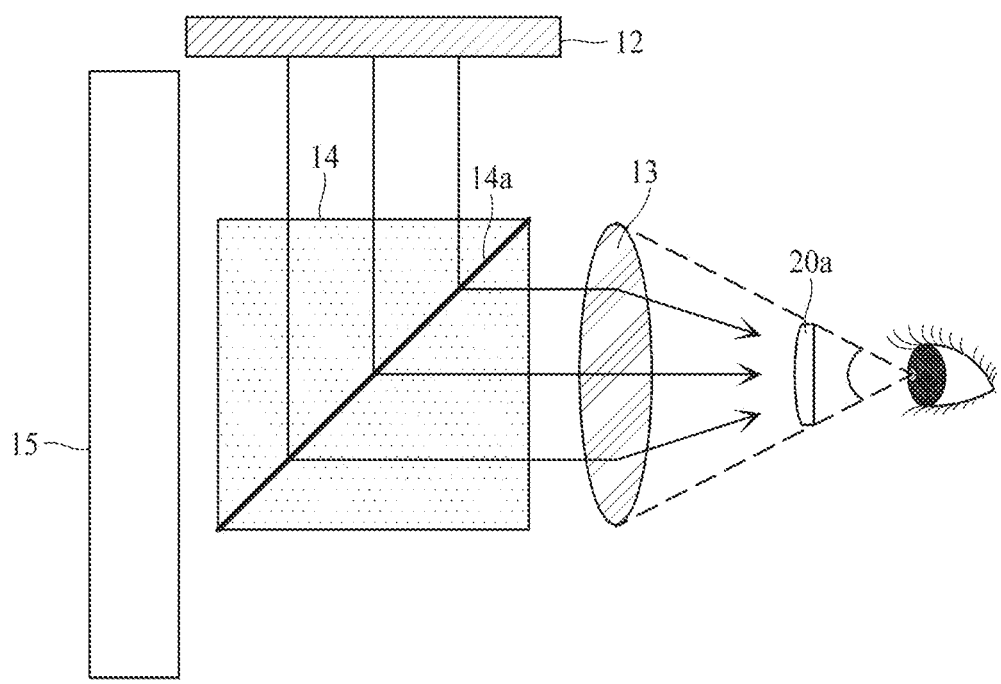

FIGS. 11A to 11C illustrate examples of an electroluminescent display device according to an embodiment of the present disclosure, which relate with a head-mounted display (HMD) device.

FIG. 11A is a schematic perspective view, FIG. 11B is a plane view of a virtual reality (VR) structure, and FIG. 11C is a cross-sectional view of an augmented reality (AR) structure. As shown in FIG. 11A, the head-mounted display (HMD) device according to an embodiment of the present disclosure may include a receiving case 10 and a head-mounted band 30.

A display device, a lens array, and an ocular eyepiece may be received (e.g., may be accommodated) in the inside of the receiving case 10. The head-mounted band 30 may be fixed to the receiving case 10. In the drawings, the head-mounted band 30 is illustrated as being configured to surround an upper surface and both lateral surfaces in a user's head, but embodiments are not limited to this structure. For example, the head-mounted band may be provided to fix the head-mounted display (HMD) device to a user's head, which may be substituted, e.g., by an eyeglass-frame shape or a helmet-shaped structure.

As shown in FIG. 11B, the head-mounted display (HMD) device of the virtual reality (VR) structure according to an embodiment of the present disclosure may include a left-eye display device 12, a right-eye display device 11, a lens array 13, a left-eye ocular eyepiece 20*a*, and a right-eye ocular eyepiece 20*b*. The left-eye display device 12, the right-eye display device 11, the lens array 13, and the left-eye ocular eyepiece 20*a*, and the right-eye ocular eyepiece 20*b* may be received in the receiving case 10.

The same image may be displayed on the left-eye display device 12 and the right-eye display device 11. For example, a user can watch a two-dimensional (2D) image. If an image for a left eye were displayed on the left-eye display device 12, and an image for a right eye were displayed on the right-eye display device 11, a user can watch a three-dimensional (3D) image. Each of the left-eye display device 12 and the right-eye display device 11 may include the display device shown in any of the examples of FIGS. 1 to 10. For example, an upper portion corresponding to a surface for displaying an image in any of the examples of FIGS. 1 to 10, e.g., the color filter layer 910, 920, and 930, may confront or face the lens array 13.

The lens array 13 may be between the left-eye ocular eyepiece 20*a* and the left-eye display device 12, while being spaced apart from each of the left-eye ocular eyepiece 20*a* and the left-eye display device 12. For example, the lens array 13 may be positioned at the front of the left-eye ocular eyepiece 20*a* and at the rear of the left-eye display device 12. Also, the lens array 13 may be between the right-eye ocular eyepiece 20*b* and the right-eye display device 11, while being apart from each of the right-eye ocular eyepiece 20*b* and the right-eye display device 11. For example, the lens array 13 may be positioned at the front of the right-eye ocular eyepiece 20*b* and at the rear of the right-eye display device 11.

The lens array 13 may be a micro lens array. The lens array 13 may be substituted by a pin hole array. Due to the lens array 13, an image displayed on the left-eye display device 12 or the right-eye display device 11 may be expanded and perceived by a user. A user's left eye (LE) may be positioned at the left-eye ocular eyepiece 20*a*, and a user's right eye (RE) may be positioned at the right-eye ocular eyepiece 20*b*.

As shown in FIG. 11C, the head-mounted display (HMD) device of the augmented reality (AR) structure according to an embodiment of the present disclosure may include a left-eye display device 12, a lens array 13, a left-eye ocular eyepiece 20*a*, a transmissive reflecting portion 14, and a transmission window 15. For convenience of explanation, FIG. 11C illustrates only the left-eye structure. The right-eye structure may be substantially similar in structure to the left-eye structure, as should be understood to one of ordinary skill in the art.

The left-eye display device 12, the lens array 13, the left-eye ocular eyepiece 20*a*, the transmissive reflecting portion 14, and the transmission window 15 may be received (e.g., may be accommodated) in the receiving case 10. The left-eye display device 12 may be disposed at one side of the transmissive reflecting portion 14, for example, an upper side of the transmissive reflecting portion 14, without covering the transmission window 15. Accordingly, an image may be provided to the transmissive reflecting portion 14, under the condition that an ambient background seen through the transmission window 15 may not be covered by the left-eye display device 12.

The left-eye display device 12 may include the display device shown in any of the examples of FIGS. 1 to 10. For example, an upper portion corresponding to a surface for displaying an image in any of the examples of FIGS. 1 to 10, e.g., the color filter layer 910, 920, and 930, may confront the transmissive reflecting portion 14.

The lens array 13 may be provided between the left-eye ocular eyepiece 20*a* and the transmissive reflecting portion 14. A user's left eye may be positioned at the left-eye ocular eyepiece 20*a*.

The transmissive reflecting portion 14 may be between the lens array 13 and the transmission window 15. The transmissive reflecting portion 14 may include a reflection surface 14*a*, which may partially transmit some light, and may also reflect the remaining light. The reflection surface 14*a* may be configured to guide an image, which may be displayed on the left-eye display device 12, toward the lens array 13. Thus, a user can watch an image displayed on the left-eye display device 12 together with the ambient background through the transmission window 15. For example, a user can watch one image obtained by a virtual image overlaid with the ambient real background, e.g., to realize an augmented reality (AR). The transmission window 15 may be disposed in front of the transmissive reflecting portion 14.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An electroluminescent display device including a first subpixel, a second subpixel, and a third subpixel, comprising:
    a substrate;
    an insulating layer on the substrate, the insulating layer comprising a trench;
    a first electrode in each of the first to third subpixels, the first electrode being on the insulating layer;
    an emission layer on the first electrode and the insulating layer; and
    a second electrode on the emission layer,
    wherein the trench is in a boundary between the first subpixel and the second subpixel,
    wherein the trench is not in an entire boundary between the second subpixel and the third subpixel,
    wherein the emission layer comprises:
        a first stack configured to emit first-colored light,
        a second stack configured to emit second-colored light different from the first-colored light, and
        a charge generation layer between the first stack and the second stack,
    wherein the first stack and the charge generation layer are each noncontiguous inside the trench in the boundary between the first subpixel and the second subpixel,
    wherein the first stack and the charge generation layer are each contiguous in the boundary between the second subpixel and the third subpixel,
    wherein the second stack is contiguous in the boundary between the first subpixel and the second subpixel, and
    wherein the second stack is contiguous in the boundary between the second subpixel and the third subpixel.

2. The electroluminescent display device of claim 1, wherein:
    the first stack comprises a red emitting layer and a green emitting layer; and
    the second stack comprises a blue emitting layer.

3. The electroluminescent display device of claim 1, wherein:
the trench is in a boundary between the first subpixel and the third subpixel; and
at least some of the emission layer is noncontiguous inside the trench.

4. The electroluminescent display device of claim 1, further comprising:
another first subpixel adjacent to the first subpixel, the another first subpixel being configured to a same-colored light as the first subpixel,
wherein the trench is not in a boundary between the first subpixel and the another first subpixel.

5. The electroluminescent display device of claim 1, wherein:
the first subpixel, the second subpixel, and the third subpixel are provided in a horizontal arrangement structure;
the horizontal arrangement structure comprises a plurality of rows along a vertical direction; and
the trench has a contiguous straight-line structure along the vertical direction.

6. The electroluminescent display device of claim 1, further comprising a fence structure surrounding a periphery of the first electrode and not directly contacting the trench.

7. The electroluminescent display device of claim 1, further comprising a fence structure surrounding a periphery of the first electrode and directly contacting the trench.

8. The electroluminescent display device of claim 1, wherein:
the first subpixel is configured to emit blue light;
the second subpixel is configured to emit one of: red light and green light; and
the third subpixel is configured to emit the other of the red light and the green light.

9. The electroluminescent display device of claim 1, wherein an interval between the first electrode of the first subpixel and the first electrode of the second subpixel is larger than an interval between the first electrode of the second subpixel and the first electrode of the third subpixel.

10. The electroluminescent display device of claim 1, further comprising:
a lens array spaced apart from the substrate; and
a receiving case configured to accommodate the substrate and the lens array therein.

11. An electroluminescent display device including a first subpixel, a second subpixel, and a third subpixel, comprising:
a substrate;
a first electrode in each of the first to third subpixels;
an emission layer on the first electrode, the emission layer being in the first to third subpixels and in a boundary area between each of the first to third subpixels; and
a second electrode on the emission layer,
wherein the emission layer comprises:
a first stack configured to emit first-colored light,
a second stack configured to emit second-colored light different from the first-colored light, and
a charge generation layer between the first stack and the second stack,
wherein the first stack and the charge generation layer are each noncontiguous in the boundary between the first subpixel and the second subpixel,
wherein the first stack and the charge generation layer are each contiguous in the boundary between the second subpixel and the third subpixel,
wherein the second stack is contiguous in the boundary between the first subpixel and the second subpixel, and
wherein the second stack is contiguous in the boundary between the second subpixel and the third subpixel.

12. The electroluminescent display device of claim 11, wherein:
a trench is in the boundary area between the first subpixel and the second subpixel; and
the first stack and the charge generation layer are non-contiguous inside the trench.

13. The electroluminescent display device of claim 12, further comprising:
an insulating layer between the substrate and the first electrode,
wherein the trench is in the insulating layer.

14. The electroluminescent display device of claim 11, wherein:
the first stack comprises red and green emitting layers; and
the second stack comprises a blue emitting layer.

15. The electroluminescent display device of claim 11, wherein:
the at least some of the emission layer is noncontiguous in the boundary between the first subpixel and the third subpixel;
the trench is in the boundary between the first subpixel and the third subpixel; and
the at least some of the emission layer is noncontiguous inside the trench.

16. The electroluminescent display device of claim 11, further comprising:
another first subpixel adjacent to the first subpixel, the another first subpixel being configured to emit a same-colored light as the first subpixel,
wherein the emission layer is noncontiguous from the first subpixel to the another first subpixel.

17. The electroluminescent display device of claim 11, wherein:
the first subpixel is configured to emit blue light;
the second subpixel is configured to emit one of: red light and green light; and
the third subpixel is configured to emit the other of: the red light and the green light.

18. The electroluminescent display device of claim 11, further comprising:
a lens array spaced apart from the substrate; and
a receiving case configured to accommodate the substrate and the lens array therein.

* * * * *